(12) United States Patent
Uzoh et al.

(10) Patent No.: US 10,700,002 B2
(45) Date of Patent: *Jun. 30, 2020

(54) ULTRA HIGH PERFORMANCE INTERPOSER

(71) Applicant: Invensas Corporation, San Jose, CA (US)

(72) Inventors: Cyprian Emeka Uzoh, San Jose, CA (US); Zhuowen Sun, Campbell, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/446,822

(22) Filed: Jun. 20, 2019

(65) Prior Publication Data

US 2019/0304904 A1 Oct. 3, 2019

Related U.S. Application Data

(60) Continuation of application No. 16/041,013, filed on Jul. 20, 2018, now Pat. No. 10,332,833, which is a (Continued)

(51) Int. Cl.
*H01L 23/522* (2006.01)
*H01L 23/48* (2006.01)
(Continued)

(52) U.S. Cl.
CPC ........ *H01L 23/5226* (2013.01); *H01L 21/486* (2013.01); *H01L 21/76802* (2013.01);
(Continued)

(58) Field of Classification Search
None
See application file for complete search history.

(56) References Cited

U.S. PATENT DOCUMENTS 8,421,183 B2 * 4/2013 Ding .................. H01L 21/76
257/508
8,426,233 B1 4/2013 Lei et al.
(Continued)

FOREIGN PATENT DOCUMENTS

EP 2337067 6/2011
WO 2011149561 12/2011
(Continued)

OTHER PUBLICATIONS

Non-Final Rejection of U.S. Appl. No. 15/601,406, filed Sep. 26, 2017 (Year: 2017).*

(Continued)

*Primary Examiner* — Telly D Green
(74) *Attorney, Agent, or Firm* — Lerner, David, Littenberg, Krumholz & Mentlik, LLP

(57) ABSTRACT

An interconnection component includes a semiconductor material layer having a first surface and a second surface opposite the first surface and spaced apart in a first direction. At least two metalized vias extend through the semiconductor material layer. A first pair of the at least two metalized vias are spaced apart from each other in a second direction orthogonal to the first direction. A first insulating via in the semiconductor layer extends from the first surface toward the second surface. The insulating via is positioned such that a geometric center of the insulating via is between two planes that are orthogonal to the second direction and that pass through each of the first pair of the at least two metalized vias. A dielectric material at least partially fills the first insulating via or at least partially encloses a void in the insulating via.

20 Claims, 14 Drawing Sheets

Related U.S. Application Data division of application No. 15/601,406, filed on May 22, 2017, now Pat. No. 10,032,715, which is a division of application No. 13/962,349, filed on Aug. 8, 2013, now Pat. No. 9,666,521.

(51) Int. Cl.
| | | |
|---|---|---|
| *H01L 23/498* | (2006.01) | |
| *H01L 21/768* | (2006.01) | |
| *H01L 23/14* | (2006.01) | |
| *H01L 21/48* | (2006.01) | |

(52) U.S. Cl.
CPC .......... *H01L 23/147* (2013.01); *H01L 23/481* (2013.01); *H01L 23/49827* (2013.01); *H01L 21/7682* (2013.01); *H01L 2924/0002* (2013.01)

(56) References Cited

U.S. PATENT DOCUMENTS

| | | | | |
|---|---|---|---|---|
| 8,975,751 | B2* | 3/2015 | Mohammed | H01L 21/486 257/774 |
| 9,666,521 | B2* | 5/2017 | Uzoh | H01L 23/147 |
| 10,032,715 | B2* | 7/2018 | Uzoh | H01L 21/486 |
| 2001/0002715 | A1 | 6/2001 | Armacost et al. | |
| 2009/0101879 | A1* | 4/2009 | Lung | H01L 45/04 257/2 |
| 2011/0132652 | A1* | 6/2011 | Ding | H01L 21/76 174/264 |
| 2012/0175782 | A1 | 7/2012 | Im et al. | |
| 2012/0267789 | A1* | 10/2012 | Mohammed | H01L 21/486 257/774 |
| 2012/0315738 | A1 | 12/2012 | Kobayashi | |
| 2013/0249011 | A1* | 9/2013 | Choi | H01L 23/481 257/369 |

FOREIGN PATENT DOCUMENTS

| | | | | |
|---|---|---|---|---|
| WO | 2012145373 | | 10/2012 | |
| WO | WO-2012145373 | A1 * | 10/2012 | .......... H01L 21/486 |

OTHER PUBLICATIONS

Bellenger et al. "Silicon Interposers with Integrated Passive Devices: Ultra-Miniaturized Solution using 2.5D Packaging Platform" 2012, pp. 1-8.
C. Dai, "High Q-factor CMOS-MEMS inductor", MEMS & MOEMS, Apr. 2008.
Final Rejection of U.S. Appl. No. 13/962,349 dated Mar. 19, 2015.
International Preliminary Report on Patentability for Application No. PCT/US2014/049998, dated Feb. 18, 2016.
International Search Report and Written Opinion for Application No. PCT/US2014/049998 dated Feb. 3, 2015.
J. Joannopoulos, "Photonic crystals molding the flow of light", Ed 2, MIT, available online: http://ab-initio.mit.edu/book/.
J. Kim, "High-Freq Scalable Electrical Model and Analysis of a Through Silicon Via (TSV)", IEEE Trans. CPMT, Feb. 2011.
Non-Final Rejection of U.S. Appl. No. 13/962,349 dated Dec. 10, 2014.
S. Bronckers, "Substrate Noise Coupling in Analog/RF Circuits", Artech House, 2009, pp. 134-135.
S. Matthias, "Pushing the limits of macroporous silicon etching", Applied Physics A, 2005.
Uzoh et al. "Deposition Processes for Competitive Through Silicon Via Interposer for 3D", IWLPC, Nov. 6-8, 2012, pp. 1-21.
Z. Xu, "Processing material evaluation and ultra-wideband modeling of through-strata-via (TSV) systems", ICSICT, Nov. 2010.

* cited by examiner

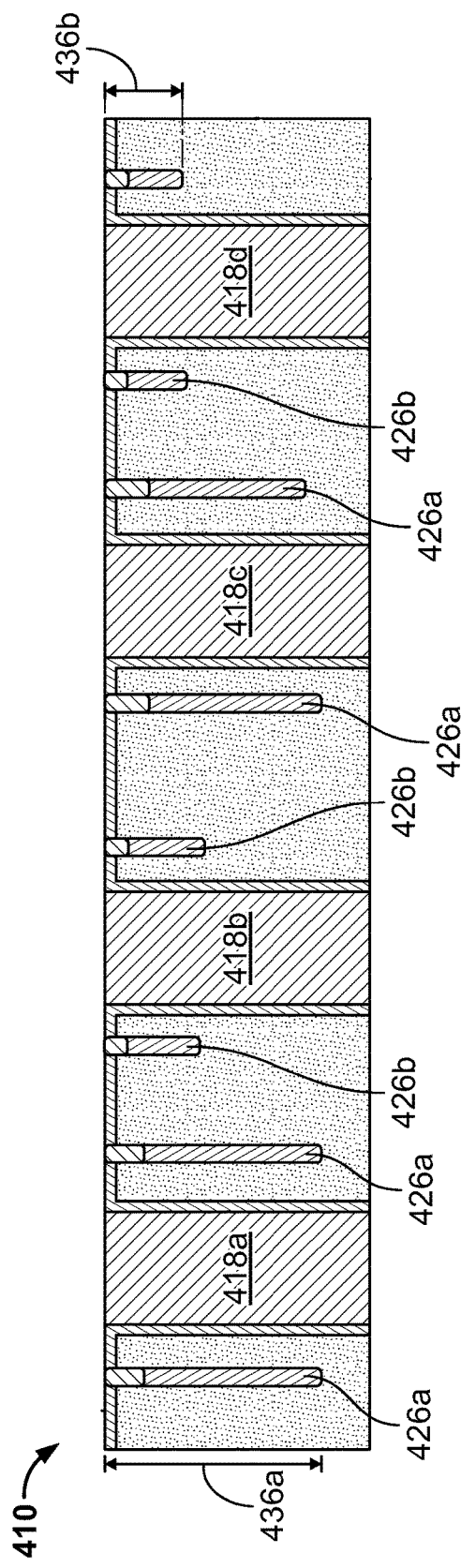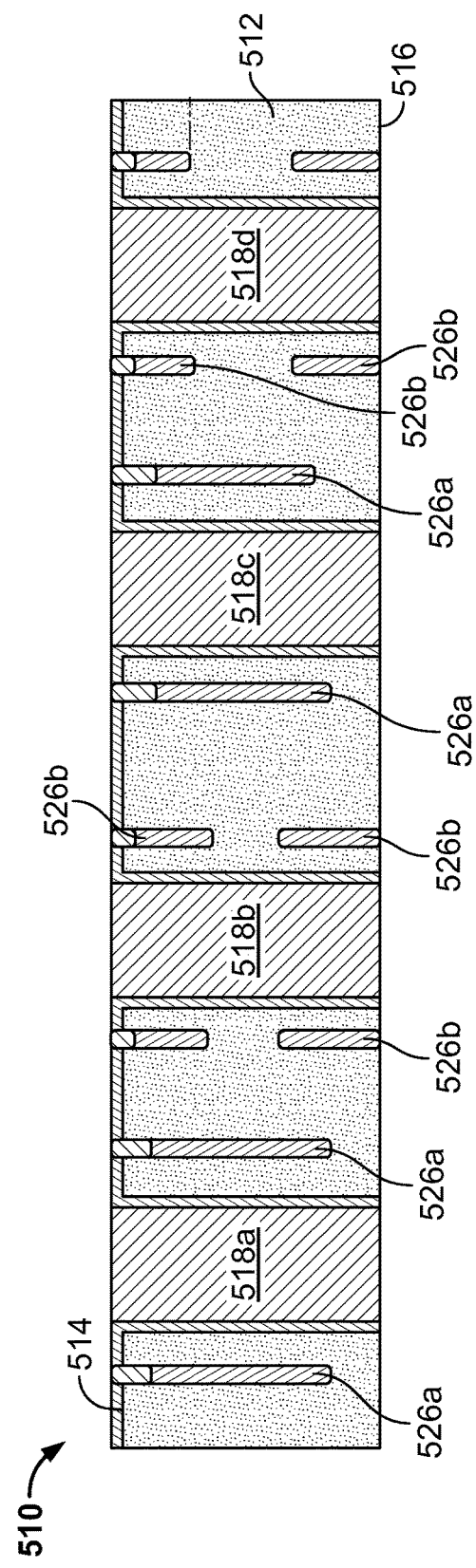

ULTRA HIGH PERFORMANCE INTERPOSER

CROSS-REFERENCE TO RELATED APPLICATION

This application is a continuation of U.S. application Ser. No. 16/041,013, filed on Jul. 20, 2018, which is a divisional of U.S. application Ser. No. 15/601,406, filed on May 22, 2017, now U.S. Pat. No. 10,032,715, which is a divisional of U.S. application Ser. No. 13/962,349, filed on Aug. 8, 2013, now U.S. Pat. No. 9,666,521, the disclosures of all of which are hereby incorporated herein by reference.

BACKGROUND OF THE INVENTION

Interconnection substrates or components, such as interposers are used in electronic assemblies for a variety of purposes such as to facilitate connection between components with different connection configurations or to provide needed spacing between components in a microelectronic assembly, among others. Interposers can include a semiconductor layer, such as of silicon or the like, in the form of a sheet or layer of material having conductive elements such as conductive vias extending within openings which extend through the layer of semiconductor material. The conductive vias can be used for signal transmission through the interposer. In some interposers, ends of the vias can be exposed and usable as contact pads for connection of the interposer to other microelectronics components. In other examples, one or more redistribution layers can be formed on interposer on one or more sides thereof and connected with one or both ends of the vias. A redistribution layer can include numerous conductive traces extending on or within one or more dielectric sheets or layers. The traces can be provided in one level or in multiple levels throughout a single dielectric layer, separated by portions of dielectric material within the layer. Vias can also be included in a redistribution layer to interconnect traces in different levels of the redistribution layer.

An example of such an interposer 1 is shown in FIG. 1A, which shows vias 3 extending through the substrate 2. The semiconductor material of the substrate 2 can be insulated from the vias 3 by a barrier layer 4 positioned therebetween. A redistribution layer 5 is shown having routing circuitry 6 therethrough. Even with the barrier layer 4 present, structures employing semiconductor material for substrate 2 can exhibit problematic levels of insertion loss through vias 3 due to impedance created therein by the capacitive qualities of the semiconductor material, for example, particularly in the areas between vias 3. This phenomenon is represented in FIG. 1B, which shows an example circuit diagram showing the effect of the capacitance and resistance of the semiconductor material of substrate 2, which in the area 7, causes impedance within the signal vias 3. The resulting insertion loss can impair the performance or reliability of such interposers and, accordingly, systems in which they are included, particularly when high-frequency signals are transmitted therethrough.

Some interposers are used as components of microelectronic assemblies. Microelectronic assemblies generally include one or more packaged microelectronic elements such as one or more semiconductor chips mounted on a substrate. The conductive elements of the interposer can include the conductive traces and terminals that can be used for making electrical connection with a larger substrate or circuit panel in the form of a printed circuit board ("PCB") or the like. This arrangement facilitates electrical connections needed to achieve desired functionality of the devices. The chip can be electrically connected to the traces and hence to the terminals, so that the package can be mounted to a larger circuit panel by bonding the terminals of the circuit panel to contact pads on the interposer. For example, some interposers used in microelectronic packaging have terminals in the form of exposed ends of pins or posts extending through the dielectric layer. In other applications, the terminals of an interposer can be exposed pads or portions of traces formed on a redistribution layer.

BRIEF SUMMARY OF THE INVENTION

An aspect of the present disclosure relates to an interconnection component for use in a microelectronic assembly and including a semiconductor material layer having a first surface and a second surface opposite the first surface and spaced apart in a first direction therefrom by a thickness of the semiconductor material layer. At least two metalized vias each extend through the semiconductor material layer and have a first end at the first surface and a second end at the second surface. A first pair of the at least two metalized vias are spaced apart from each other in a second direction orthogonal to the first direction. A first insulating via in the semiconductor layer extends from the first surface toward the second surface. The insulating via is positioned such that a geometric center of the insulating via is between two planes that are orthogonal to the second direction and that pass through each of the first pair of the at least two metalized vias. A dielectric material at least partially fills the first insulating via or at least partially encloses a void in the insulating via.

In an example, no portion of the interior volume of the insulating via has an electrical conductivity greater than an electrical conductivity of the semiconductor material layer. In another example, at least a portion of the interior volume can be an evacuated or gas filled void. At least a portion of the interior volume can be occupied by a dielectric material having a dielectric constant of less than 2.0.

The insulating via can be positioned such that a theoretical line through each of the first pair of metalized vias passes through the geometric center of the first insulating opening. Additionally or alternatively, the opening can have a length in a direction perpendicular to the second direction. The length can be greater than the distance between the first pair of the at least two metalized vias.

In an example, the insulating via can at least partially surround one of the vias in the first pair of the at least two metalized vias. The insulating via can, for example, continuously surround at least one portion of at least one of the metalized vias. In another example, the insulating via can be one of a plurality of insulating vias within a predetermined area of the semiconductor material layer, the insulating vias being arranged to at least partially surround at least one of the metalized vias. In such an example the insulating vias of the predetermined area can be cylindrical, and can be arranged in at least one row extending generally in a third direction perpendicular to the second direction and the first direction.

The insulating via can, in one example, extend through the entire thickness of the semiconductor material layer. In the same or another example, a second pair of the at least two metalized vias can be spaced apart from each other in a third direction orthogonal to the first direction. In such an example, the interconnection component can further include a second insulating via in the semiconductor layer, the second insulating via being positioned such that such that a geometric center of the insulating via is between two planes that are orthogonal to the third direction and that pass through each of the second pair of the at least two metalized vias. One of the vias of the first pair of metalized vias can be included in the second pair of metalized vias. The first insulating via can define a first area in a cross section parallel to the first surface, the second insulating via can define a second area in a cross section parallel to the first surface, and the first area can be greater than the second area. Further, the first and second insulating vias can have different heights.

Another aspect of the present disclosure can relate to a microelectronic interconnection component, including a dielectric material layer including a first surface and a second surface that is substantially parallel to the first surface and is spaced apart therefrom in a first direction. The dielectric material layer has a bulk dielectric constant. At least two metalized vias each extend through the semiconductor material layer and have a first end at the first surface and a second end at the second surface. A first pair of the at least two metalized vias are spaced apart from each other at a distance in a second direction orthogonal to the first direction. A first insulating via in the semiconductor layer extends from the first surface toward the second surface and defines an interior volume. The insulating via is positioned such that a geometric center of the insulating via is between two planes that are orthogonal to the second direction and that pass through each of the first pair of the at least two metalized vias. A dielectric constant of the interior volume is less than the bulk dielectric constant. In an example, no portion of the interior volume has an electrical conductivity greater than an electrical conductivity of the semiconductor material layer.

Another aspect of the present disclosure relates to a method for making a microelectronic interconnection component. The method includes selectively etching a support material layer having a thickness to simultaneously form a plurality of first via openings spaced apart from each other in a first direction, and at least one second via opening in the semiconductor layer. The at least one second via opening has an entrance at the first surface and extending in the first direction toward the second surface. The second via opening defines an interior volume is positioned between two planes that are orthogonal to the first direction and that pass through each of a pair of adjacent ones of the first via openings. The method further includes forming electrically conductive vias within the plurality of first via openings, and providing a dielectric material within at least the entrance of the second via opening so as to close the opening.

The method can further include plugging the second via opening with a high-pressure TEOS plug prior to the step of filling the first via openings. The high-pressure TEOS plug can be formed during the application of a conformal passivation coating to the support material layer.

Additionally or alternatively, the method can further include forming a redistribution layer at least one of the first and second surfaces of the support material layer. The redistribution layer can include conductive features in electrical communication with the filled vias.

BRIEF DESCRIPTION OF THE DRAWINGS

FIG. 9 shows a schematic elevation view of an interposer according to FIG. 8 with additional structures therein;

FIG. 10 shows a schematic elevation view of an interposer according to FIG. 9 with additional structures therein;

DETAILED DESCRIPTION

Figure 1A:
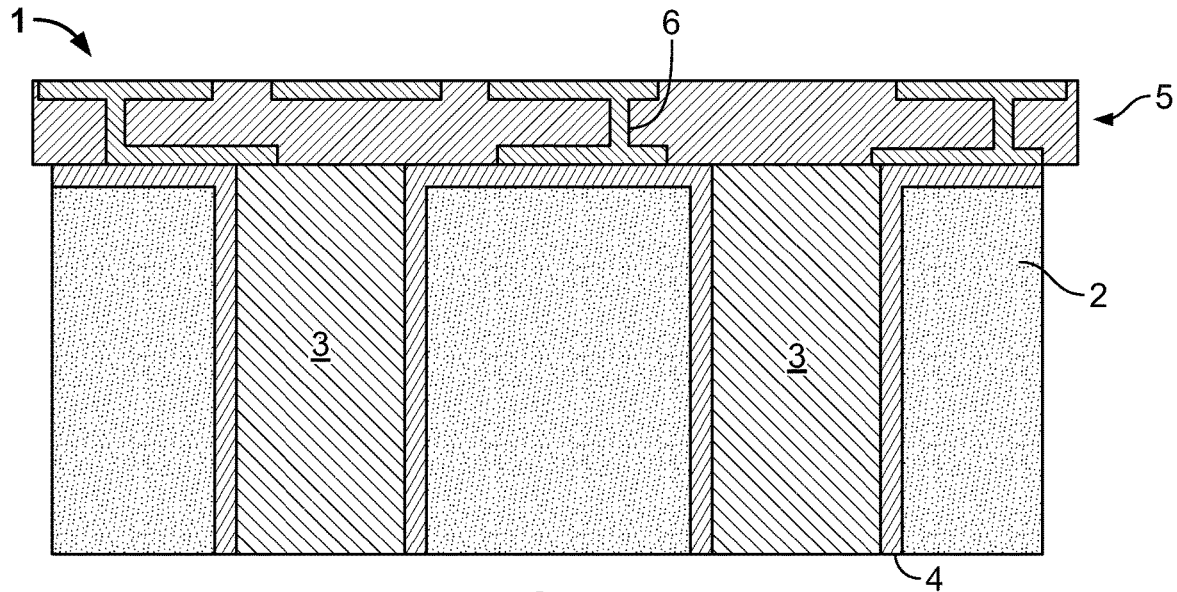
FIG. 1A shows a prior art interposer in a schematic elevational view.
Figure 1B:
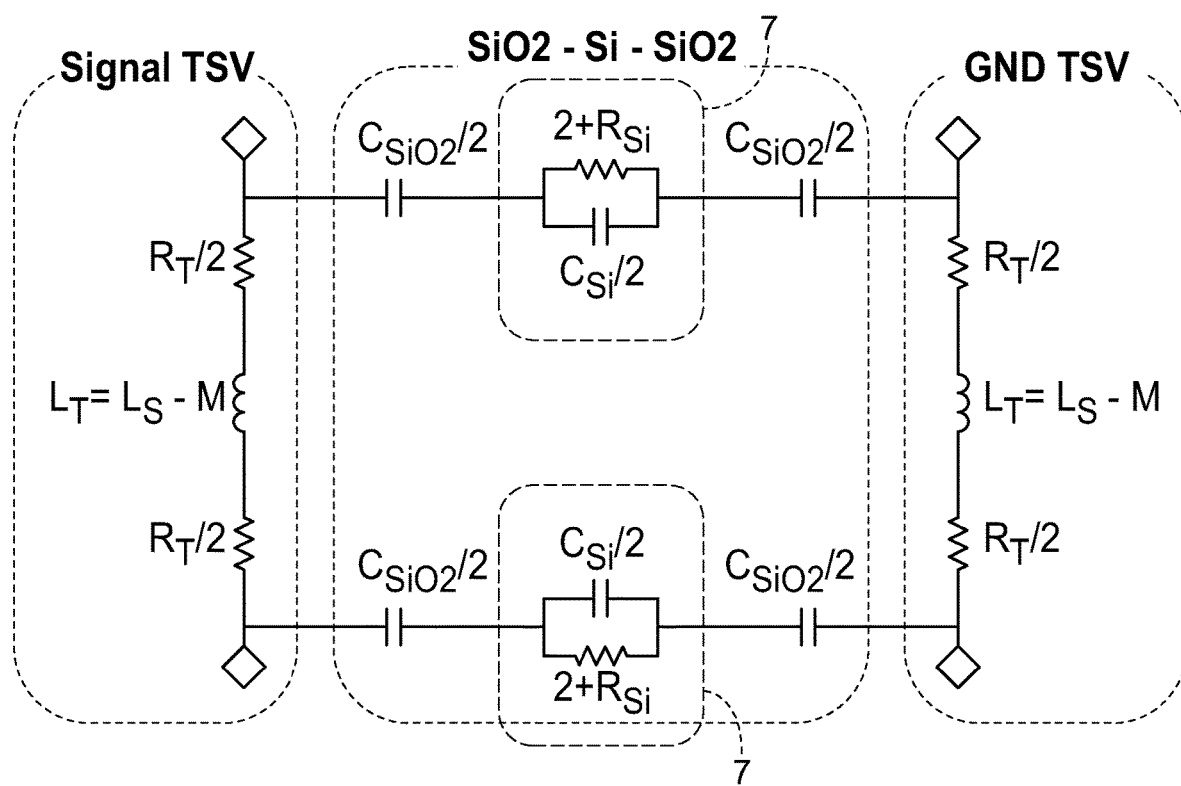
FIG. 1B shows a representation of the interposer of FIG. 1A in a schematic circuit diagram.
Figure 1:
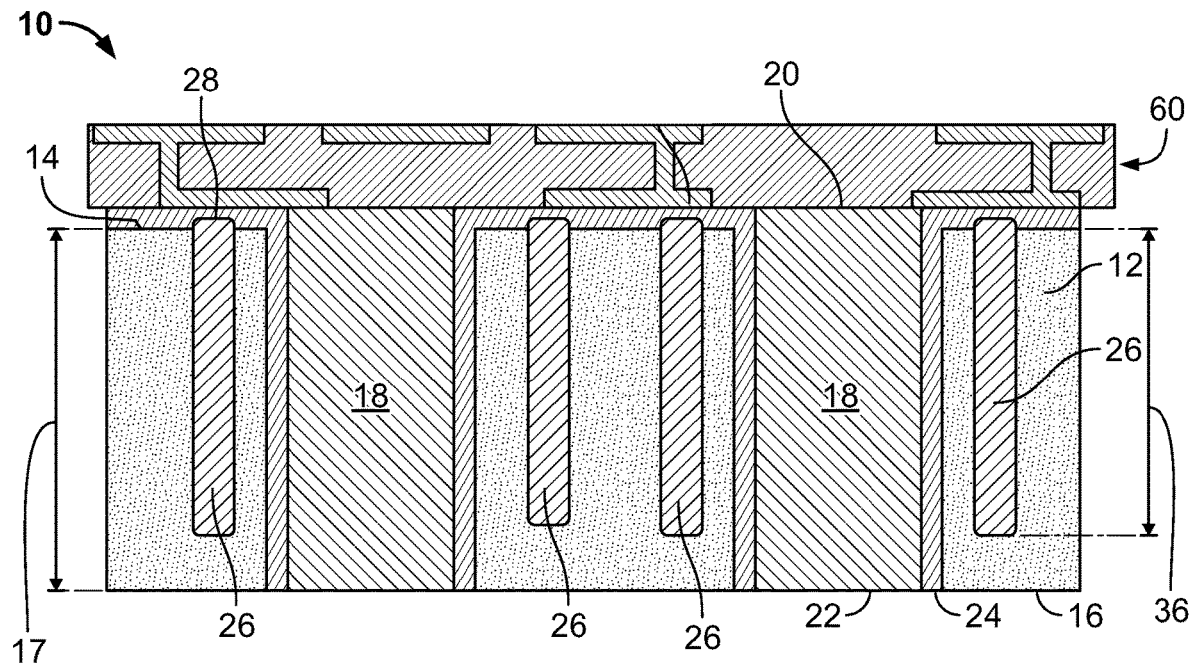
FIG. 1 shows a schematic elevation view of an interposer according to an aspect of the present disclosure.
Figure 2:
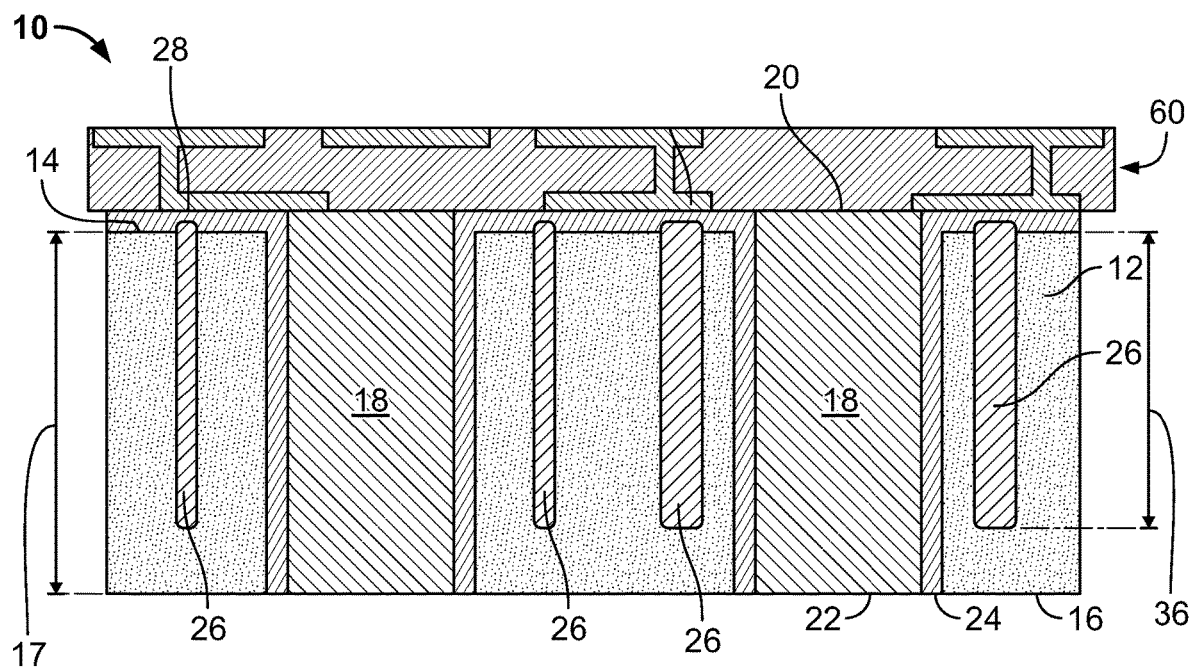
FIG. 2 shows a schematic elevation view of an interposer according to another aspect of the present disclosure.

Turning to the figures wherein similar reference numbers are used to indicate similar features, FIG. 1 shows an example structure according to an example embodiment of the present disclosure. The structure is in the form of an interposer 10 and the depiction thereof in FIG. 1 represents an elevational cross-sectional schematic view thereof. The interposer 10 includes a substrate 12 of a semiconductor material such as Silicon (Si), polymeric, ceramic, carbon based substrates such as diamond, SiC, Ge, $Si_{1-x}Ge_x$, or the like. Substrate 12 includes an upper surface 14 and a lower surface 16 that extend in lateral directions and are generally parallel to each other at a thickness of the substrate 12. It is noted that the use of terms such as "upper" and "lower" or other directional terms is made with respect to the reference frame of the figures and is limiting with respect to potential alternative orientations, such as in further assemblies or as used in various systems.

A plurality of metalized via structures 18 can extend within openings which extend through the substrate 12. Via structures 18 can be generally cylindrical or can be in the form of an extruded solid of any shape in a profile communicating or extending between surfaces 14 and 16 of substrate 12. Via structures 18 each include a first end surface 20 at upper surface 14 of substrate 12 and a second end surface 22 at lower surface 16 of substrate 12. The end surfaces 20 and 22 can be used to connect via structures 18 with other internal or external components, as described further below. Via structures 18 can generally consist of a metallic or other conductive material filling an opening through substrate 12. In various examples the metal of a via structure 18 can be copper or a copper alloy and can additionally or alternatively include other conductive materials such as nickel, tungsten, tin, aluminum, gold, silver, various alloys including one or more of the these materials, or the like. The metal portion of the via structure 18 can also include non-metallic additives to control various characteristics of the via structure 18.

A barrier layer 24 can included in via structures 18 to physically separate the substrate 12 from the conductive material of the via structure 18. Barrier layer 24 can be of an insulating or dielectric material and can be positioned between any conductive portions of via structure 18 and substrate 12 such that electronic signals carried by the via structures 18 are not transmitted into substrate 12, which can cause signal loss and/or shorting of circuits that interposer 10 is a part of.

Interposer 10 can include many more than the two via structures 18 shown in FIG. 1, as necessary to achieve the desired number of electrical connections between microelectronic structures in a system (including between packaged chips, and other chips, printed circuit boards, other interposers, or the like, and various combinations of the preceding). The via structures 18 can be arranged, for example, in an array including various numbers of rows and columns of via structures 18. In such an arrangement the via structures 18 can be spaced apart from one another according to a pitch, i.e. a uniform distance between the via structures 18 in the directions of both the rows and columns. Other arrangements are possible, including various non-uniform distributions of via structures 18.

As discussed above, some semiconductor materials can exhibit levels of capacitance between via structures 18, within a substrate 12 of such material. Such capacitance can result in undesirable levels of impedance and signal loss within interposer 10 or through via structures 18. Even further, materials having a dielectric constant of greater than or equal to one, including doped semiconductor materials such as Si or the like, can exhibit the above-described capacitance as well as instances of conductance between via structures 18. This can further contribute to signal loss within an interposer 10 including via structures 18 within a substrate 12 of such material. Accordingly, the example of interposer 10 shown in FIG. 1 and other examples discussed herein can include various structures to reduce the amount of semiconductor material between adjacent via structures 18. In the example of FIG. 1, a plurality of openings 26 in the substrate 12. The openings 26 can vary in positioning with respect to vias 18 as well as in their height and width, as will be discussed further herein. Even further, the number of openings between respective via structures 18 can vary within an interposer 10.

The position, quantity, depth and overall volume can be varied within an interposer 10 to control levels of impedance and/or conductance within the interposer 10, as may be desired depending on the architecture of the overall circuit or system in which interposer 10 is used. In other examples, the openings 26 can be positioned to reduce impedance and/or conductance to below a desired level or to an extent where the impedance, conductance and desired overall amount of Si within the interposer 10 are optimized.

As shown in FIGS. 3A-3D, a number of dimensions related to the size and position of openings 26, in some instances relative to adjacent via structures 18, can be configured or adjusted to provide desired levels of controlled or reduced insertion loss, capacitance, conductance, or impedance within substrate 12. As discussed in the aforementioned figures, the dimensions that can influence the characteristics of an interposer 10 including openings 26 of the present disclosure can be measured with respect to a theoretical line 40 extending between adjacent via structures 18. Further, such dimensions can include the width 44 of the opening 26 in a direction perpendicular to line 40, the width 48 of the opening 26 in a direction parallel to the line 40, the distance 42 of the geometric center of the opening 26 from the line 40 and the height 36 of the opening 26.

Figure 3A:
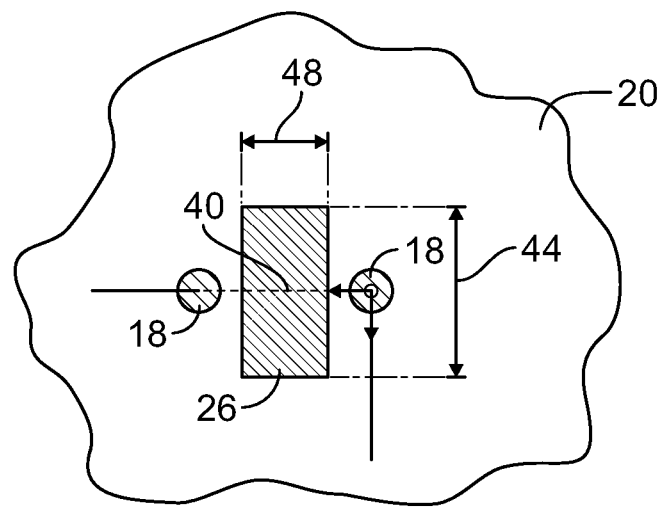
FIGS. 3A-3D show variations in the size and positioning of an opening in interposers according to various aspects of the disclosure.
Figure 3B:
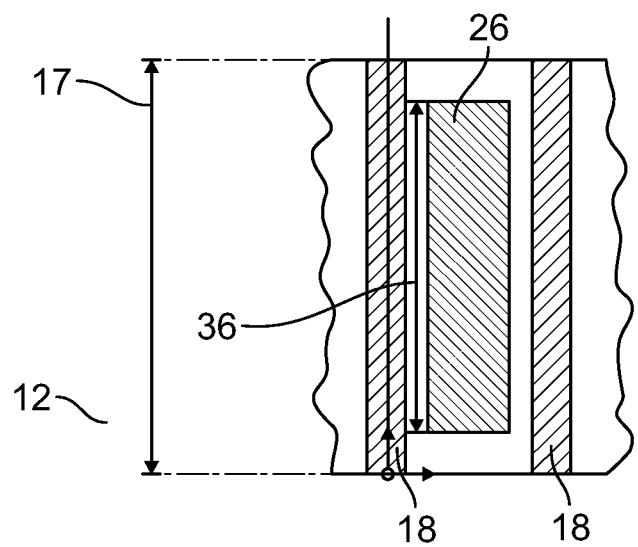

The height 36 of the opening 26 can be a factor in reducing insertion loss within interposer 10 or otherwise controlling characteristics thereof that are influenced by the capacitance and/or conductance of the substrate 12 materials. As shown in FIGS. 3A and 3B, the height 36 can be equal to or less than the thickness or height 17 of substrate 12. The height 36 can, accordingly, be measured as a percentage of the height 17 of substrate 12. In one example, a change in height 36 of opening (while maintaining other dimensions) from about 25% of the total substrate height 17 to about 100% of total substrate height 17 can reduce insertion loss by between about 0.05 dB and 0.1 dB (depending on other factors, such as the other dimensions of opening 26 the material of substrate 12, and the frequency of the signal through via structures 18, for example).

Figure 3C:
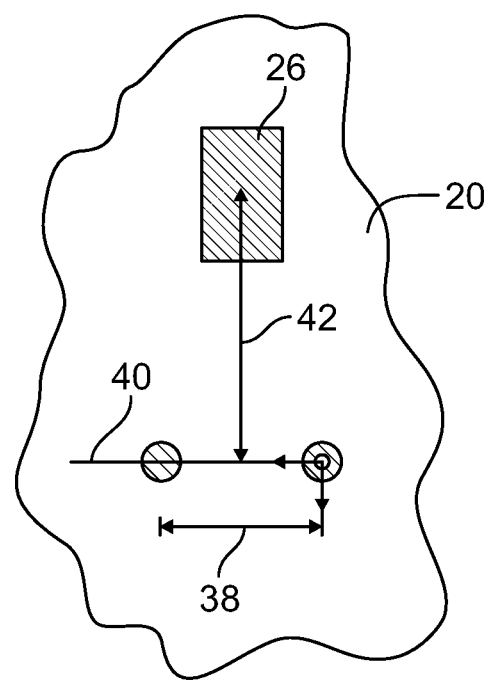
Figure 3D:
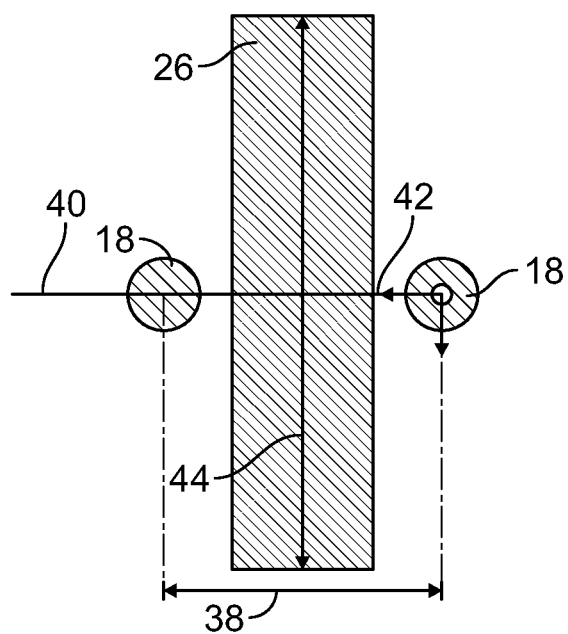

Similarly, the distance 42 of the opening 26 from the line 40 between via structures 18 can affect the insertion loss within interposer 10. In the example of FIG. 3C, opening, can have a width 44 that is about equal to the pitch 38 between via structures 18 (+/−20%, e.g.). The width 48 can be less than the pitch 38 by at least an amount to optionally fit between via structures 18 without compromising the structural integrity of the interposer 10. In such an example, a change in the distance 42 from 150% of the pitch 38 to about 100% of the pitch 38 (while maintaining other dimensions and characteristics constant) can reduce insertion loss by between about 0.03 dB and 0.05 dB, for example. By further reducing distance 42 to zero (i.e. such that the geometric center of opening 26 lies on line 40), the insertion loss can be further reduced by between about another 0.03 dB to 0.05 dB. Again, on other factors, such as the other dimensions of opening 26 the material of substrate 12, and the frequency of the signal through via structures 18 can affect the insertion loss measurements in other example interposers, as can the overall dimensions of the interposer. For example, the above insertion loss figures can be based on an interposer with via structures 18 that are about 100 microns in height. Such figures would, in a similar example of taller via structures 18, vary proportionately with the height of the via structures 18. For example, an interposer having via structures of 300 microns, for example, may have insertion loss reductions achieved through a proportionately similar structure by between about 0.09 dB and 0.15 dB. It is also noted that in many structures such as that shown in FIG. 3C or similar structures, the effects of opening 26 on any insertion loss between adjacent via structures 18 may be minimal if distance 42 is greater than 150% of the pitch 38.

Variation in the width 44, itself, can also affect insertion loss in interposer 10. In the example, shown in FIG. 3D, an opening 26 can have a width 48 that is less than the pitch 38 between via structures 18 and the geometric center of opening 26 can be positioned on line 40. In such a structure, an increase in width 44 of opening 26 from a width that is 25% of the pitch 38 to a width that is 50% of the pitch 38 can reduce insertion loss by between about 0.04 dB to 0.06 dB. An additional increase in width 44 to a width that is about 150% of the pitch 38 can additionally reduce insertion loss by between about 0.04 dB to 0.06 dB. In such a structure or other similar structures, the effect of an increase to widths beyond 200% of the pitch may be minimal with respect to further increases in insertion loss. As in the example given above with respect to the distance of opening to line 40, the various dimensions of the example interposer and related structures can alter the particular values of insertion loss reduction, proportionately or otherwise, and the figures given herein are exemplary with respect to the dimensions set out with respect thereto.

Figure 4:
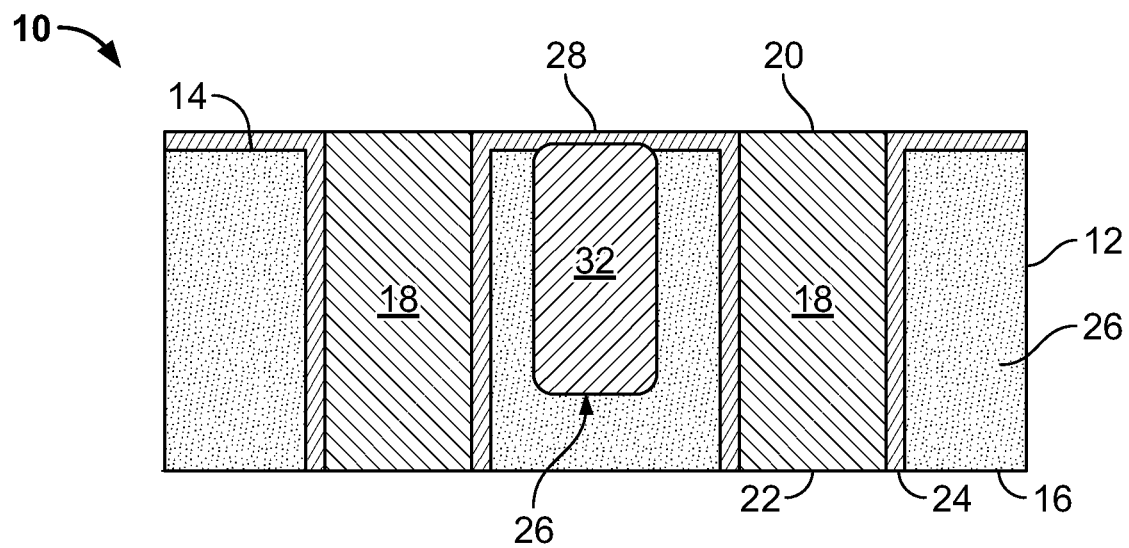
FIG. 4 shows a schematic elevation view of an interposer according to an aspect of the present disclosure.

As shown in FIG. 4, an interposer 10 can have a single opening 26 positioned between adjacent via structures 18. The representation in FIG. 4 is meant as a simplified, schematic view and, accordingly can represent a section of an interposer with many more via structures 18 that can be, as discussed above, arranged in an array extending in a number of rows and columns. Accordingly, an interposer 10 including an array of via structures 18 can include multiple openings 26 positioned in areas between all via structures 18 such that the openings 26 themselves are in an array that fits within or is overlaid with the array of via structures 18. In an alternative structure, examples of which are given below, openings of different shapes, sizes or other configurations can be distributed between adjacent via structures 18 as desired to provide varied levels of controlled impedance for the individual via structures 18 in interposer 10. In other examples, similarly sized or shaped openings 26 can be present between certain ones of the via structures 18 and can be not included between other via structures 18. Further, openings 26 can be positioned in different respective locations relative to the theoretical lines 40 between various ones of the via structures 18.

Figure 19:
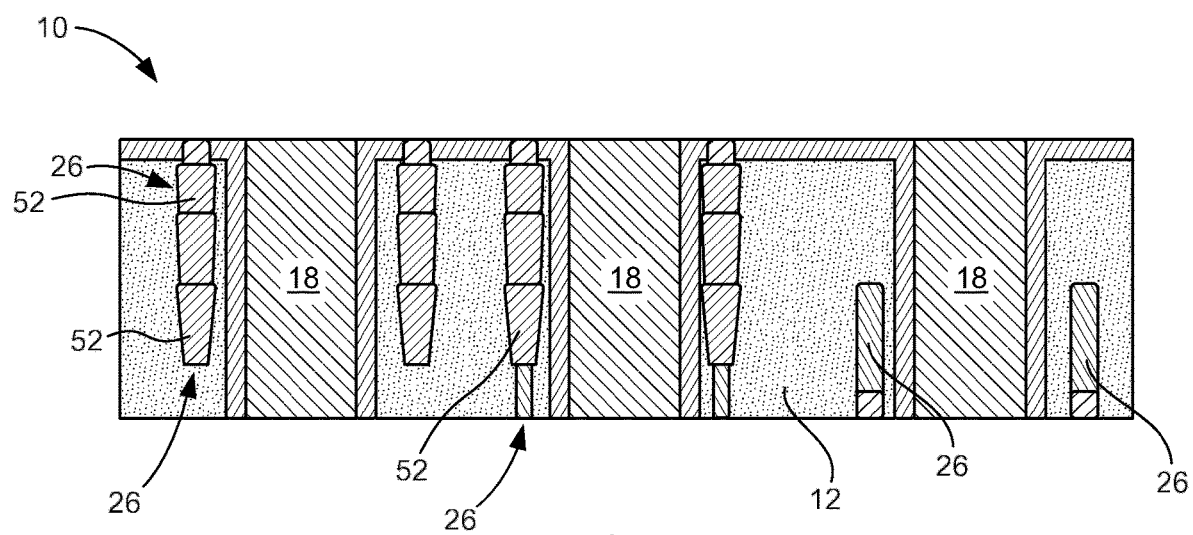
FIG. 19 shows a schematic elevation view of an interposer with rigid inserts in openings according to an aspect of the present disclosure.

In the example of FIG. 4, a single opening 26 is present between adjacent via structures 18 (and can be similarly present between other via structures). The opening 26 can be filled with a dielectric material to maintain the structural integrity of substrate 12. In one example, the dielectric constant of the material introduced into the opening 26 can be lower than that of the substrate 12 to reduce insertion loss. In such an example, a greater difference in dielectric constant between the substrate 12 and the lower dielectric constant of the material in opening 26 can lead to greater reductions in insertion loss (with other dimensions and characteristics being equal). Suitable dielectric materials to fill opening 26 include SiO2, polymeric material, porous oxide, porous dielectric, low k materials, or any other dielectric material with a dielectric constant of less than 2.0, for example. Further various dielectric foam materials such as polyimide foam, TEOS, or benzocyclobutene ("BCB") can also be incorporated in openings 26. In one example, a conformal dielectric layer may be applied on so as to substantially coat the walls of opening 26. Such dielectric material 32 can have a surface 33 flush with a respective one of upper surface 14 or lower surface 16 of substrate 12 (depending on the construction of opening 26, as discussed below). In another example shown in FIG. 19, dielectric spacers 52 can be inserted into an opening 26. The dielectric spacers 52 can be pre-formed of any of the dielectric materials discussed above and can be wedge-shaped or conical to facilitate pressing thereof into the openings 26. As further shown in FIG. 19, the multiple spacers can be stacked on top of each other within an opening 26 to fully or partially fill the opening 26 to varying degrees.

As discussed above, the width 48 of opening 26 (as well as the width 44, which extends in and out of the page in the view of FIG. 3A) can vary with respect to the pitch 38 of the via structures 18 that opening 26 is positioned between. In some instances, the widths 44 and 48 of opening 26 can be greater than the diameters of the respective via structures 18. Further, opening 26 can be rectangular, as shown in FIGS. 3A-3D or cylindrical such that widths 44 and 48 are the same and define the diameter of the opening 26. The opening 26 can have an entrance 28 at upper surface 14 of substrate 12 and can extend into substrate 12 such that the height 36 of opening 26 can be between 35% and 80% of the overall height of substrate 12. In a variation of the example shown in FIG. 4, opening 26 can have a height 36 that is greater than 80% of the thickness of substrate 12. For example, the height 36 of opening can be at least 90% of the substrate 12. In some examples, opening 26 can extend through substrate 12 such that opening 26 further defines an entrance at lower surface 16 of substrate 12. In a further variation, an opening can have an entrance on lower surface 16 only and can have a height of between about 35% and 80% of the thickness of substrate 12.

Figure 5:
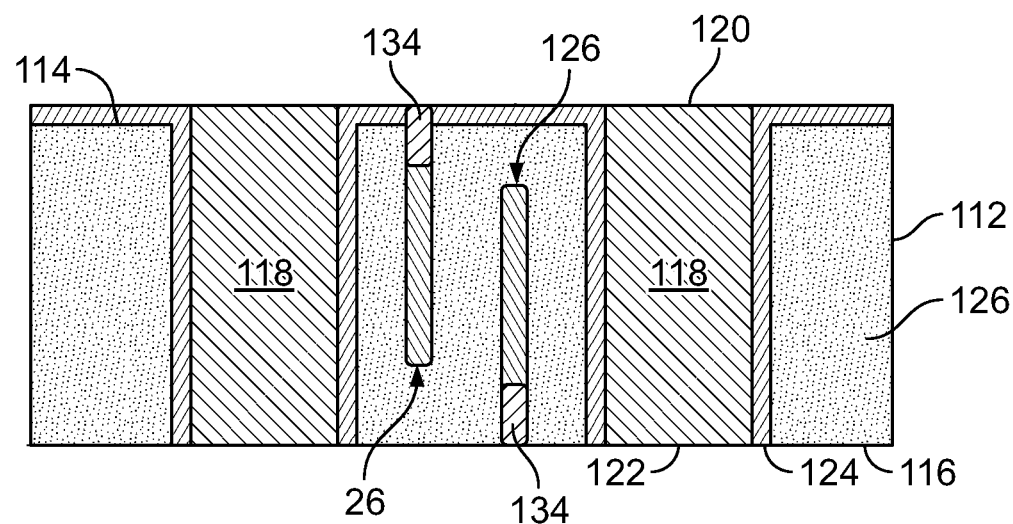
FIG. 5 shows a schematic elevation view of an interposer according to an aspect of the present disclosure.

As shown in FIG. 5, openings 126 can be only partially filled with a dielectric fill 134. In such an example, partial dielectric fill 134 can define an outer surface generally flush with a respective one of upper surface 114 and lower surface 116 of substrate 112. The partial dielectric fill 134 can extend only partially through the height 136 of opening 126 and can serve as a plug to prevent other materials (such as materials used in redistribution layers that can be included over one or both of upper surface 114 and lower surface 116) from filling opening 126. Dielectric fill 134 can, accordingly, retain vacuum, any air or another gas, such as nitrogen or the like, captured within opening 126. Partial dielectric fill 134 can also cover or close an evacuated region within opening 126. In such an example, the partial dielectric fill 134 can be of Tetraethyl orthosilicate ("TEOS"), which can be positioned using a high-pressure application procedure. As also shown in FIG. 5, multiple openings 126 can be positioned between a single adjacent pair of via structures 118. Such multiple openings 126 can be offset from each other along a theoretical line between vias (similar in position to line 40 in FIG. 3A) and in a direction perpendicular to such a theoretical line such that the openings 126 are not directly aligned with each other in a direction between via structures 118. Further, openings 126 can include entrances from opposite surfaces 114 or 116 of substrate 112, as shown in FIG. 5. Such openings 126 can have the same or different heights. In another example, the openings can both enter from the same surface (114 or 116). Further only a single partially-filled opening 126 of the type shown in FIG. 5 can be included between adjacent via structures 118.

Figure 6:
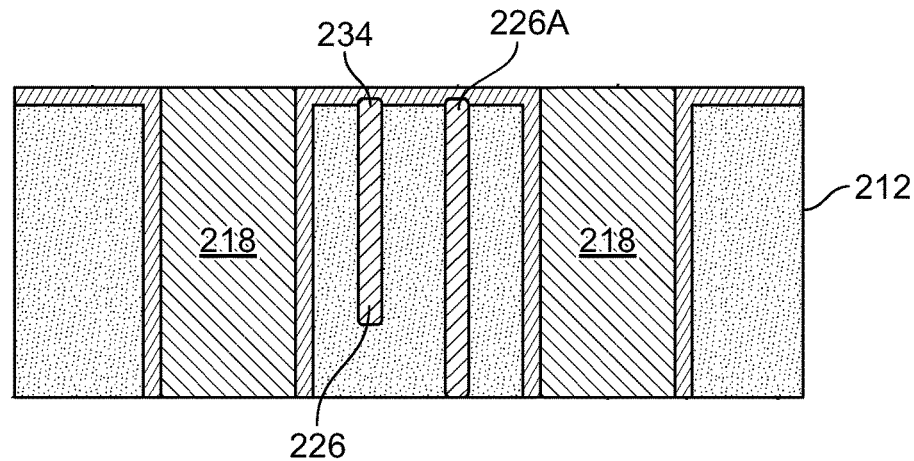
FIG. 6 shows a schematic elevation view of an interposer according to an aspect of the present disclosure.

As shown in FIG. 6, openings of the type shown in FIG. 5 can include dielectric fills 234 that completely fill openings 226 in a manner similar to those discussed above with respect to FIG. 4. Specifically, such openings 226, 226A can include multiple openings 226 positioned between adjacent via structures 218, where opening 226A extends through the entire thickness of the substrate 212. Such a dielectric fill 234 can be of a solid dielectric material or a dielectric foam, as described above. The openings 226 can be aligned or offset from each other in a direction parallel with a theoretical line between vias (similar in position to line 40 in FIG. 3A), as also discussed above. In general, various opening structures and configurations discussed herein can be implemented using fully or partially filled openings and can include no fill.

Figure 7:
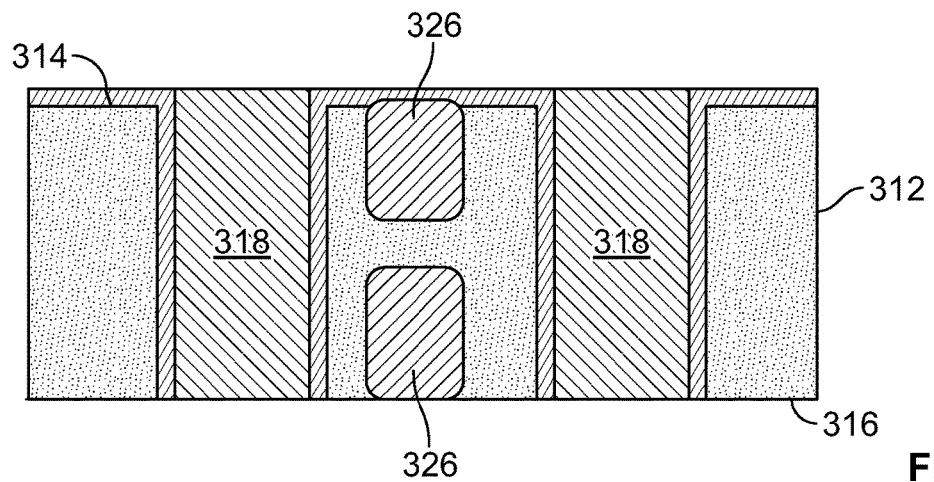
FIG. 7 shows a schematic elevation view of an interposer according to an aspect of the present disclosure.

In a further variation shown in FIG. 7, separate openings 326 can have respective entrances on opposite surfaces 314 and 316 of substrate 312. The openings 326 can be vertically aligned with each other such that they occupy a single opening area between via structures 318. Such openings 326 can have different respective heights that can combine to be less than, for example 90% of the thickness of substrate 312. Other examples are possible wherein the combined heights of openings 326 are greater than 90% of the substrate thickness.

Figure 8:
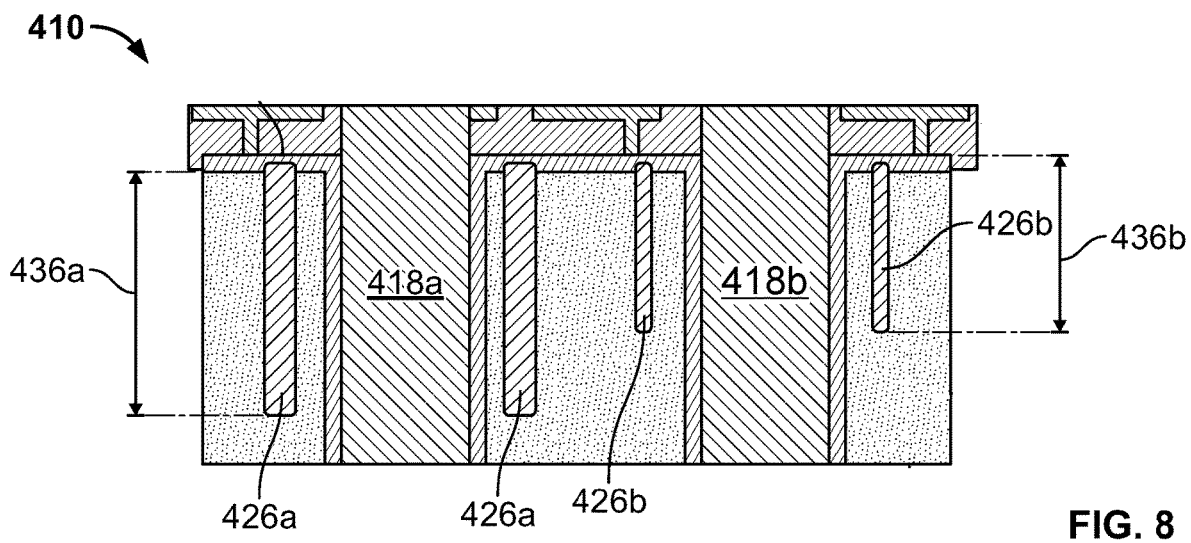
FIG. 8 shows a schematic elevation view of an interposer according to an aspect of the present disclosure.

Openings, such as those discussed above, can be in a number of different locations and configurations within an interposer. In the example of FIG. 8, openings 426 can be positioned adjacent to respective via structures 418. In such an arrangement, multiple openings 426 can be positioned between adjacent via structures 418. The distance between such openings 426 or, in other words, the distance of the openings 426 to the respective via structures 418, can also affect the insertion loss affecting the signals passing through the respective via structures 418, such that a greater distance can further reduce insertion loss. As further shown in FIG. 8, the openings 426a and 426b associated with the various via structures 418a and 418b in interposer 410 can have different heights or depths 436a and 436b. As discussed previously, this can be done to provide controlled impedance between the via structures 418 within an interposer. This can include control of the impedance associated with the via structures shown in FIG. 8 (418a and 418b) or associated with additional vias that can be present in such an interposer 410.

As will be discussed later, the heights of the openings 426a and 426b can be related to the widths of the openings. For example, in a structure wherein the openings 426a and 426b are formed simultaneously using a chemical etchant, a wider opening 426a can achieve a greater depth 436a than the depth 436b of opening 426b when exposed to an etchant for a predetermined duration.

As discussed previously, the insertion loss present within a given via structure in an interposer is a product of capacitance within a substrate contributing to impedance within the particular via structures. In a substrate that supports more than two via structures, for example, the impedance within an individual via structure can be reduced or controlled by the configuration of the opening or openings surrounding the given via structure. For example, the interposer 410 in FIG. 9 is similar to that shown in FIG. 8 but depicts additional via structures 418a, 418b, 418c, and 418d, each with multiple openings 426 associated therewith. Accordingly, the impedance present within the via structures 418a that are surrounded by the relatively taller and wider openings 426a can be lower than that present within the via structures 418b surrounded by the relatively narrower and shorter openings 426b. This or other structures following similar principles can provide controlled impedance within individual via structures or groups of via structures that can be useful in certain interposers that are used in packaged microelectronic structures with various needs and requirements.

FIG. 10 shows another configuration of openings 526a and 526b that can be incorporated within an array of via structures 518a, 518b, 518c, and 518d to provide controlled impedance among the via structures 518. In this example, the relatively shorter and narrower vias 526b extend into substrate 512 from both upper surface 514 and lower surface 516 thereof. In a further variation, the configurations of interposer 410 in FIG. 9 and interposer 510 of FIG. 10 can be used in a single interposer that can include both the relatively taller and relatively shorter openings extending from the upper substrate surface, the lower substrate surface, or both.

Figure 11:
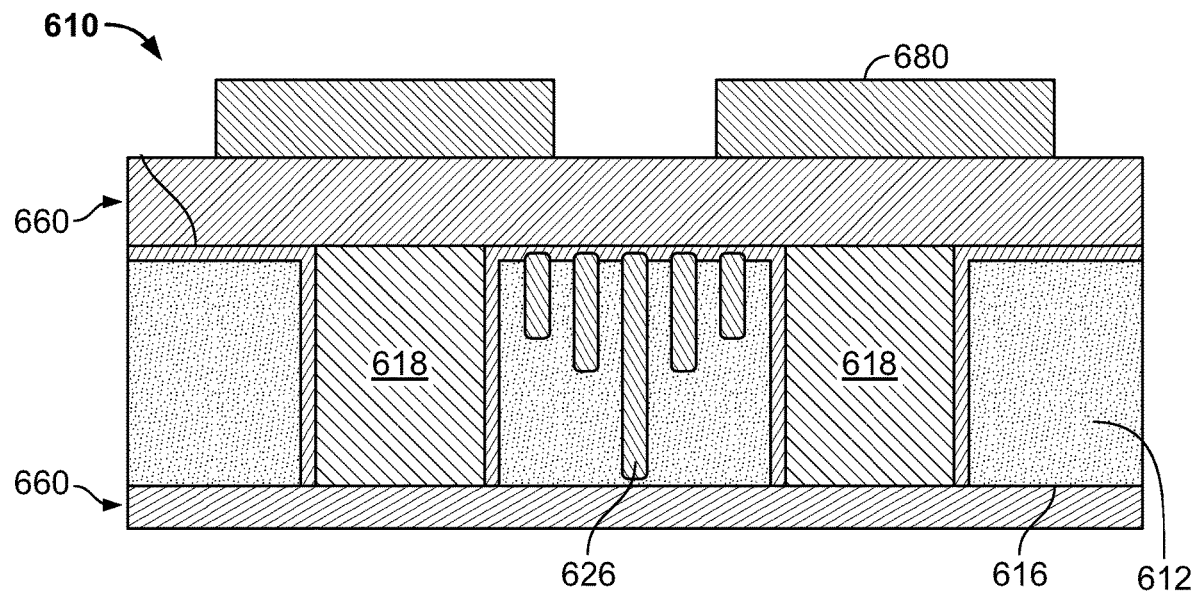
FIG. 11 shows a schematic elevation view of an interposer according to an aspect of the present disclosure.
Figure 12:
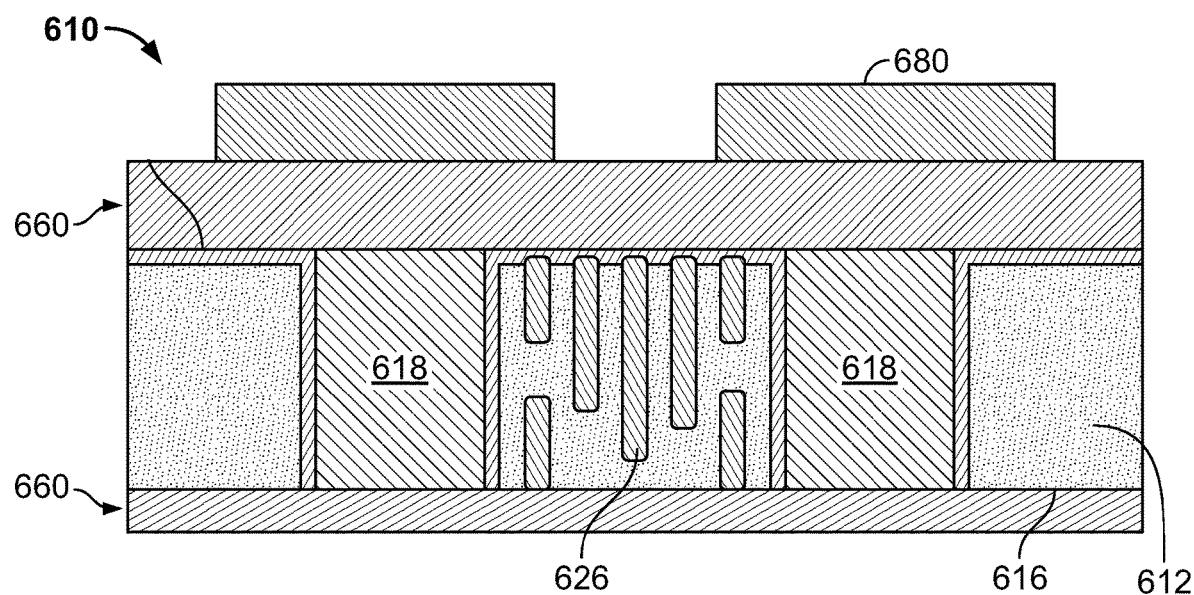
FIG. 12 shows a schematic elevation view of an interposer according to FIG. 11 with additional structures therein.

FIGS. 11 and 12 show interposers 610 with graded and intertwined openings 626. In particular the interposer 610 of FIG. 11 shows a plurality of openings 626 between a pair of via structures 618. The openings 626 increase in height from shorter openings near the via structures 618 to taller openings toward a location centered between via structures 618. Such openings 626 can also vary in width in a direction in and out of the page in FIG. 11, and can be positioned in staggered or aligned positions relative to via structures 618. FIG. 12 shows a similar graded opening 626 arrangement with additional openings 626 entering from lower surface 616 of substrate 612. These and further variations can be used to achieve various levels of controlled impedance between and within via structures 618. FIGS. 11 and 12 also show interposers 610 with microelectronic elements 680 mounted thereon, which can be connected with via structures 618 through redistribution layer 660, according to the particular configurations of the connections of the microelectronic elements.

FIGS. 13-17 show various shapes and arrangements that can be used for openings according to profiles thereof along the upper (and/or lower) surface of a respective substrate. The openings of the profile shapes discussed with respect to these figures can have heights according to any of the configurations and combinations discussed above and can vary within the various groups of openings discussed herein. The views shown in FIGS. 13-17 are schematic and are intended to illustrate types of openings and arrangements thereof. The relative positions in which they are shown and the combinations shown in the individual figures do not necessarily reflect intended use in an actual interposer structure.

Figure 13:
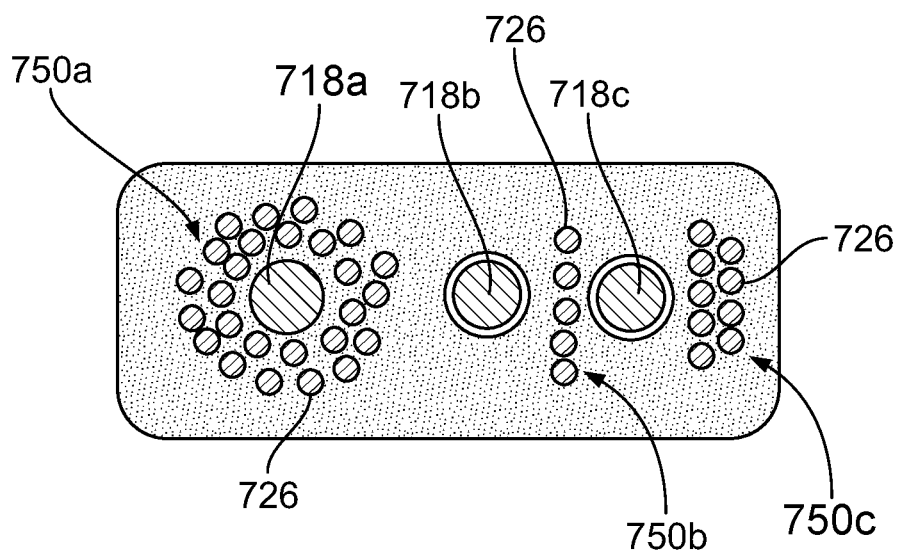
FIGS. 13-17 show schematic top views of portions of interposers including varying geometries and configurations of openings formed therein.

In particular, FIG. 13 shows cylindrical openings 726 grouped within opening areas 750 of various configurations. For example, the opening area 750a shown surrounding via structure 718a is in a generally circular configuration. The openings 726 in opening area 728a can be arranged in two concentric circles or can be randomly clustered into an area generally resembling a circle, as shown. The openings 726 grouped within opening area 750b (between via structure 718b and 718c) can be in a single row and can be spaced apart from each other such that a predetermined number of openings 726 extend through a predetermined distance. The openings 726 within opening area 750c (adjacent via structure 718c) are linearly arranged as well, but are included in two staggered, intertwined rows.

Figure 14:
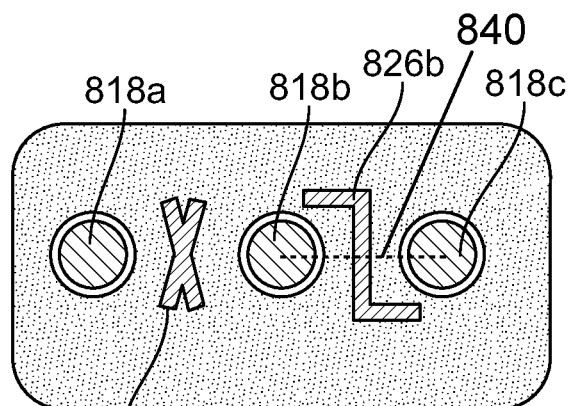

FIG. 14 shows various openings that are generally linear but extend in multiple directions. The opening 826a between vias 818a and 818b is generally X-shaped and can be wider or narrower than what is shown in FIG. 14 (i.e. the X can be more open or more closed). The opening 826b between vias 818b and 818c is of a somewhat zig-zag shape extending between vias 818b and 818c in a direction perpendicular to line 840 and the extends toward vias 818b and 818c on respective, opposite sides of line 840 in directions parallel thereto. Such an arrangement can provide controlled impedance in varying directions relative to opening 826b for the vias 818b and 818c associated therewith. That is, impedance thereof would be more affected by other vias in a similar structure that are positioned around one of vias 818b or 818c that does not have a portion of opening 826b therebetween.

Figure 15:
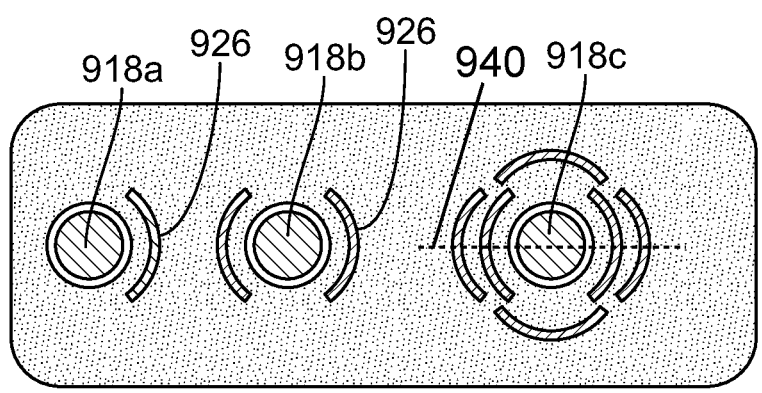

FIG. 15 shows various arrangements of semi-circular openings 926. As shown, such semi-circular openings 926 can be approximately a quarter circle (i.e. extending through a 90° angle). A single one of such an opening 926 can be positioned adjacent and surrounding a portion of a via structure 918a, as desired. In other implementations, multiple openings 926 can be positioned around various areas of the periphery of a via structure, such as via structure 918b, which is shown with two openings 926 on opposite lateral sides thereof. Similarly, via structure 918c includes two openings 926 each on the lateral sides of via structure 918c along line 940, with a single opening 926 on the remaining opposing sides of via structure 918c.

Figure 16:
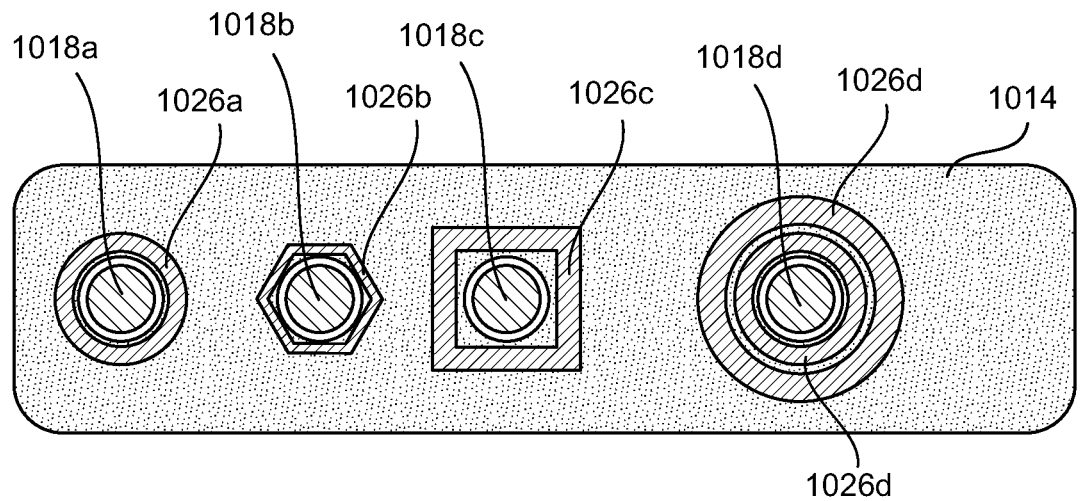

FIG. 16 shows openings 1026 with profiles of varying geometric shapes. These shapes can surround entirely the individual via structures 1018 with which they are associated and can be formed have a height that is less than the overall substrate thickness. Openings 1026a and 1026d are circular with a single circle surrounding via 1018a, and two nested circles, which can be arranged concentrically, surrounding via 1018d. Other, multi-sided geometric shapes can be used for openings, such as the hexagonal opening 1026b surrounding via structure 1018b and the square opening 1026c surrounding via structure 1018c.

Figure 17:
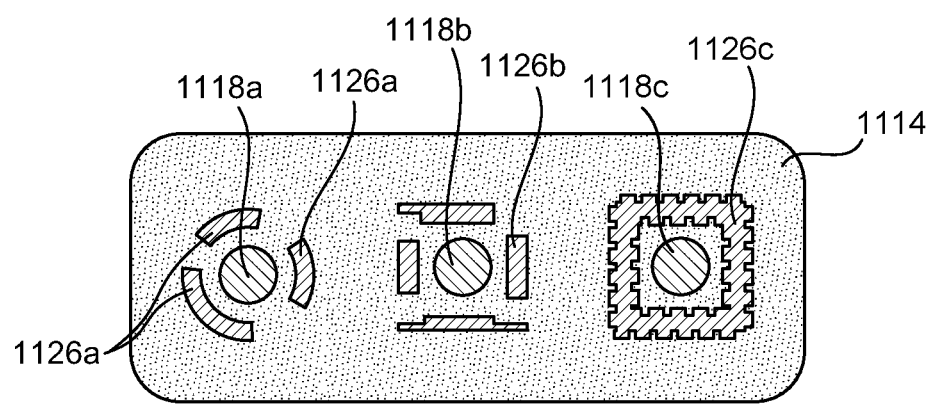

In other examples, groups of openings can form discontinuous geometric shapes. As shown in FIG. 17, arced, or semi-circular, openings 1126a can collectively surround a via structure 1118a in a generally circular shape with interruptions therein in the form of portions of the substrate material extending therebetween. As also shown, the ends of the openings 1126a and 1126b can be irregularly shaped, as shown. Similarly, a plurality of linear openings 1126b can collectively surround via structure 1118b in a square arrangement. A continuous shape can also be irregular in nature, such as the jagged square-shaped opening 1126c surrounding via structure 1118c.

Figure 18:
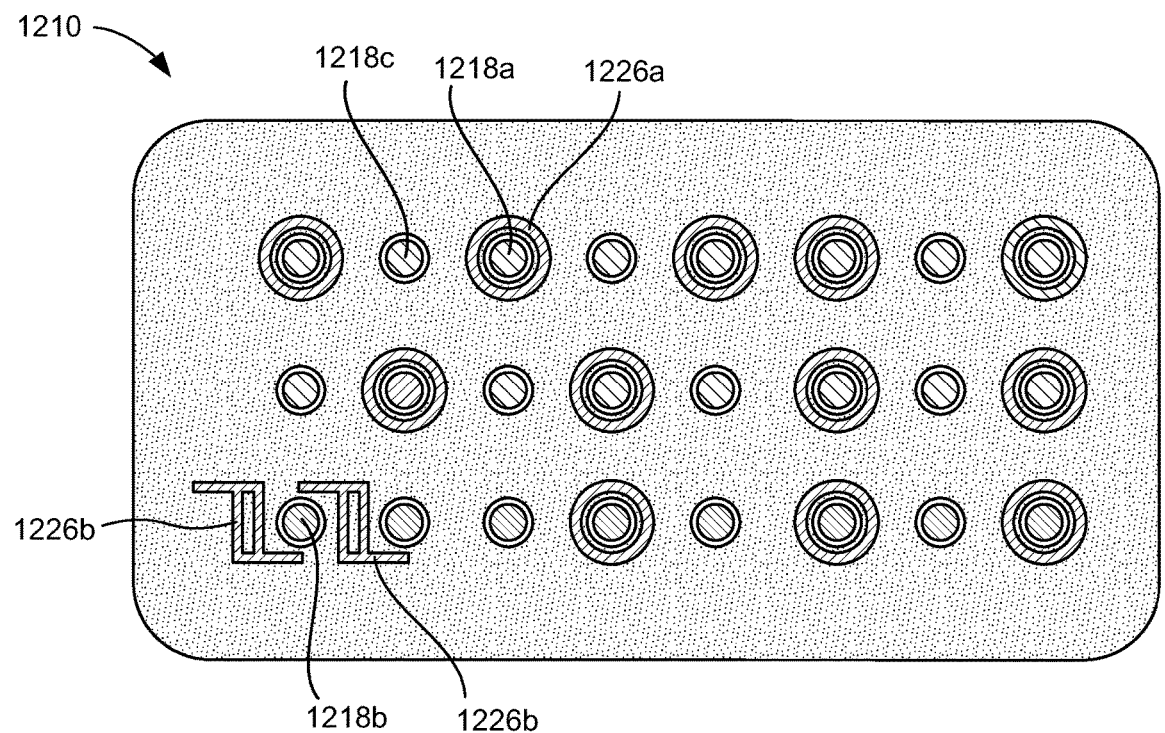
FIG. 18 show a schematic top views of an interposer including varying geometries and configurations of openings formed therein.

The varying shapes and configurations of openings discussed above can be used alongside each other in a single interposer structure to provide controlled and varying impedance among via structures. FIG. 18 shows an example of an interposer 1210 including an array of via structures 1218 in a substrate. Some of the via structures 1218a are surrounded by a continuous, circular opening 1226a, while other via structures 1218b are partially surrounded by varying portions of zig-zag openings 1226b. Still other via structures 1218c are not immediately surrounded by any openings, although the openings surrounding adjacent via structures, such as via structures 1218a can reduce insertion loss and/or impedance caused by such adjacent via structures 1218a. The particular arrangement and incorporation of different shapes or configurations of the openings can be done to provide different levels of impedance within the different via structures of the interposer, as needed based on the usage and requirements of the interposer and based on the characteristics discussed above.

Figure 20A:
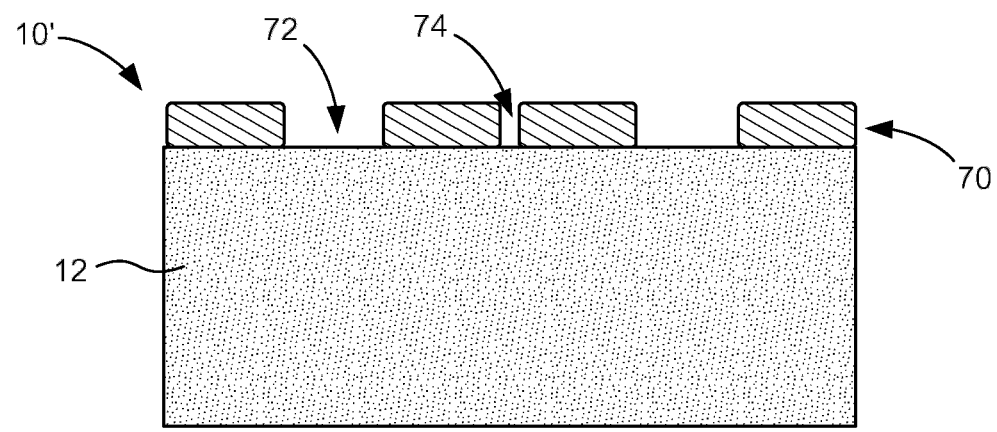
FIGS. 20A-20F show an in process unit during successive steps in a method of fabricating an interposer according to an aspect of the disclosure.

FIGS. 20A-20F show an in-process unit 10' during various stages of fabrication of an interposer 10 according to an example of the present disclosure. As shown in FIG. 20A, the fabrication method can start by forming a mask layer 70 over upper surface 14 of substrate 12. A plurality of windows 72,74 can be formed in mask layer 70 in the area of features to be formed in substrate 12 by etching. Such etching can include photo etching, reactive ion etching, chemical etching, or the like. Accordingly the windows 74 can be in the general profile shape of the openings to be formed, including any of those discussed above, as desired. The locations of the windows 74 can also reflect the desired locations of the openings to be formed, according to the various criteria and characteristics discussed above.

Figure 20B:
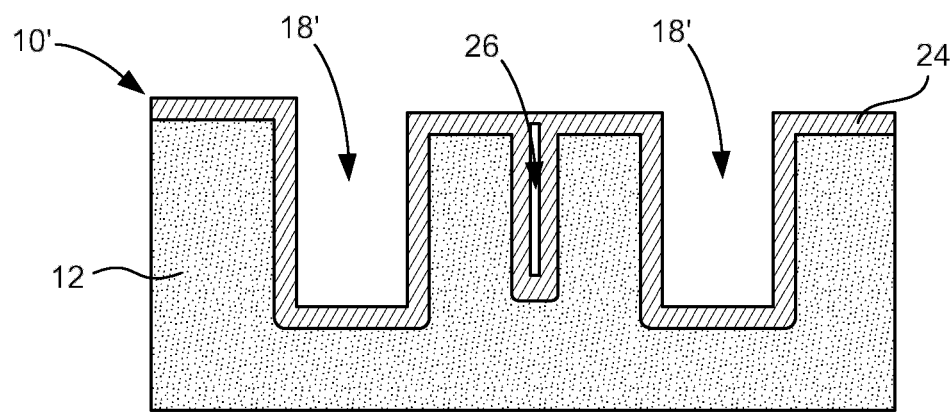
Figure 20C:
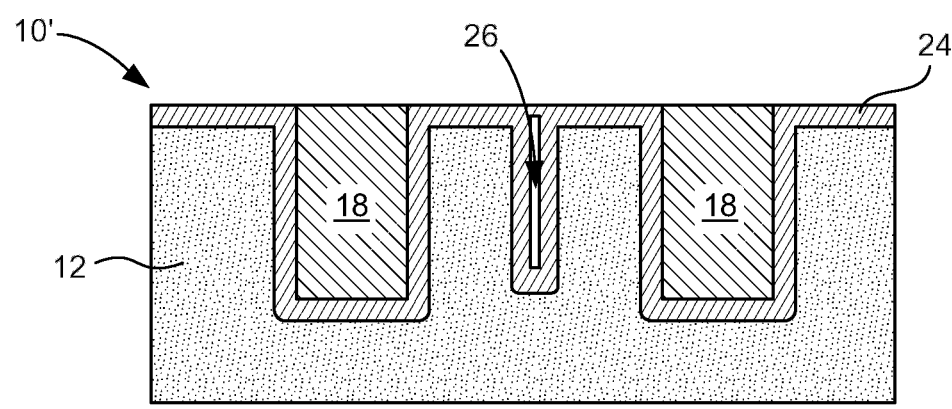
Figure 20D:
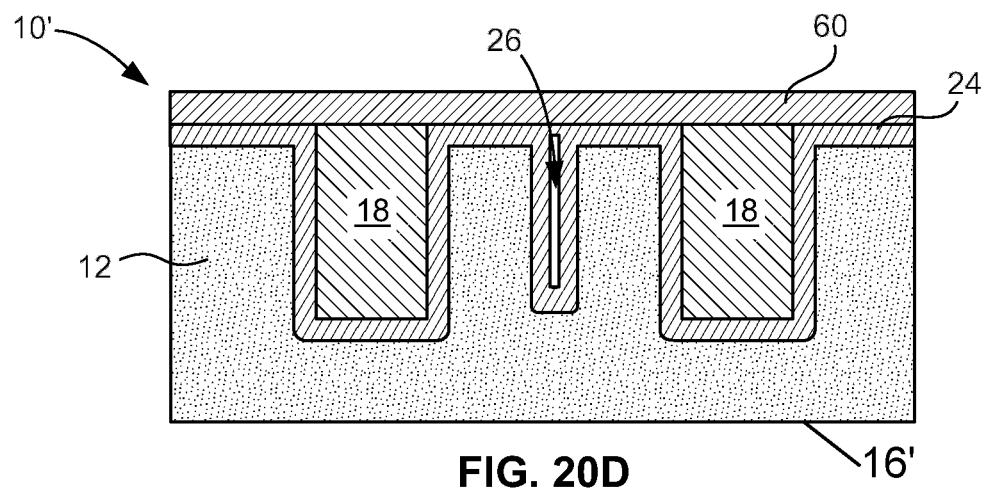

The resulting in-process unit 10' can then be subjected to an etching process, whereby substrate material uncovered by the mask (i.e. by windows 72 and 74) are removed. The resulting structure can include a plurality of partial, unfilled vias 18' and openings 26 in substrate 12. As shown in FIG. 20B, a barrier layer 24 can be formed over upper surface 14 of the substrate 12 and filling the unfilled vias 18' and openings 26. In the example shown, the diameter of the openings is such that the barrier layer itself closes the entrance 28 of the opening, retaining air, for example, therein and closing off opening 26.

The unfilled vias 18' can then be filled with a metal such as copper or the like. This can be done by first forming a seed layer, such as by chemical vapor deposition or the like and then electroplating metal over the seed layer to fill the vias and provide the resulting partial via structures 18. A redistribution layer 60 can then be formed over upper surface 14, as well as the end surfaces 20 of the partial via structures 18. The redistribution layer can include a dielectric layer with embedded traces, vias and contact pads to provide offset or redistributed contacts over an outside surface thereof that are connected with respective ones of the via structures 18.

Figure 20E:
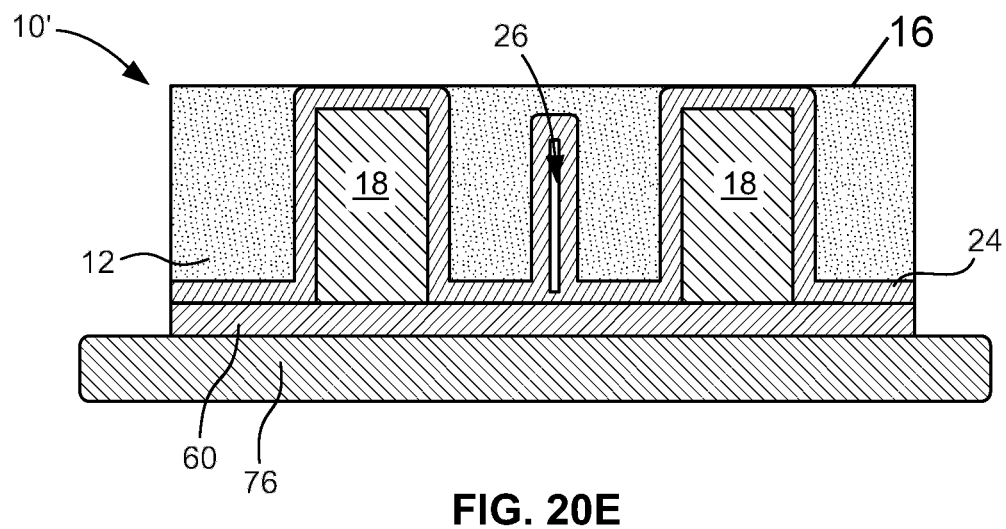
Figure 20F:
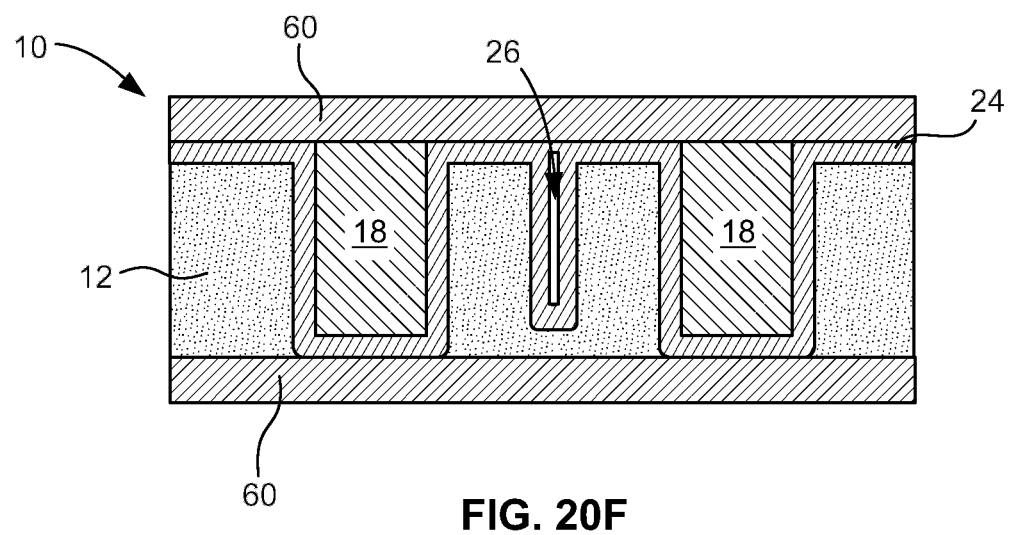

After formation of the redistribution layer 60 (if desired), the in-process unit 10' can be inverted and temporarily mounted on a carrier 76, as shown in FIG. 20E. At this point additional openings can optionally be formed by applying another mask layer over surface 16' and by etching to form openings therein according to any of the various configurations discussed above. The surface 16' of the substrate 12 can then be ground or polished to remove material from substrate 12 such that surfaces 22 of via structures 18 are exposed at surface 16 of substrate 12. Surfaces 22 can also be generally planarized during this process. Another redistribution layer can optionally be formed over surface 16, as discussed above, and interposer 10 can be removed from the carrier 76.

Figure 21A:
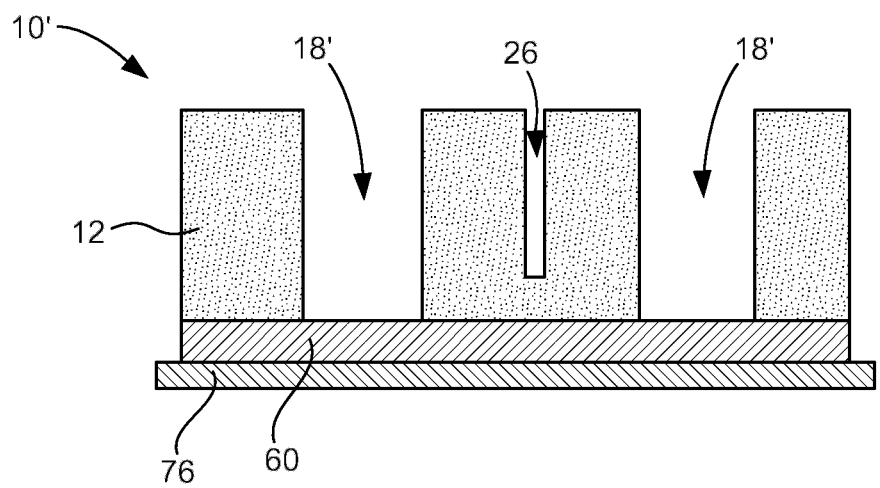
FIGS. 21A-21C show an in process unit during alternative method steps.
Figure 21B:
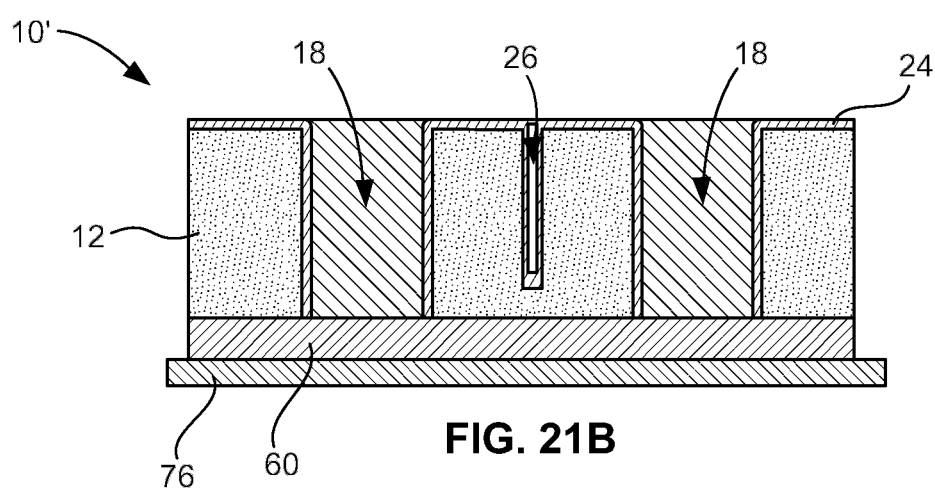
Figure 21C:
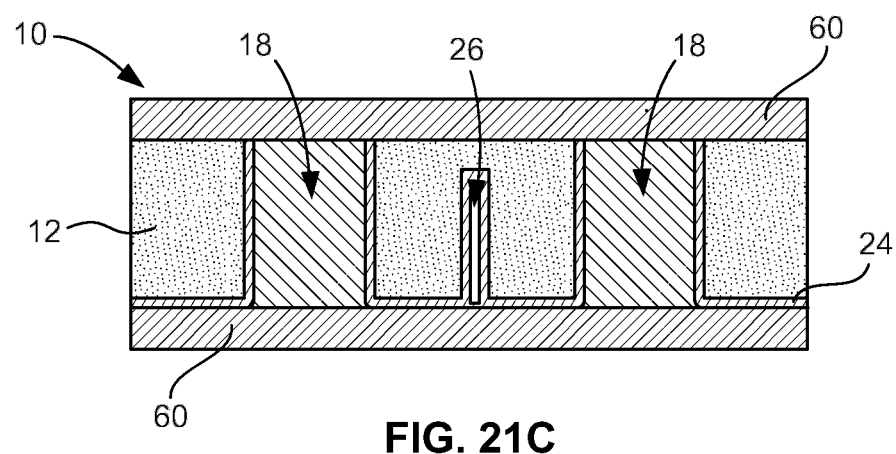

In a variation of such a method, steps of which are depicted in FIGS. 21A-21C, a redistribution layer 60 can be formed on the first surface of a substrate prior to the attachment of the substrate to a carrier, and substrate 12 can be formed thereon or otherwise attached thereto. The resulting structure can then be etched, as described above, using a mask layer with appropriately configured windows to form openings 26 and unfilled vias 18', which extend through substrate 12 to expose portions of redistribution layer 60. A barrier layer can then be formed, as discussed above with respect to FIG. 20B prior to depositing a metal within the unfilled vias 18' to form via structures 18, as shown in FIG. 21B. Another redistribution layer can optionally be formed over surface 14, as shown in FIG. 21C either before or after removal of the interposer 10 from the carrier 76.

In some embodiments, the upper surface 14 and the lower surface 16 of substrate 12 may comprise of devices and electrical component on both surfaces, and in other embodiments, the substrate may comprise a buried insulating layer within the substrate. The buried insulating layer or cavity of this invention may be parallel or perpendicular to the surfaces 14 and 16 of the substrate.

Other fabrication methods are also possible and can be adapted from other methods of general interposer fabrication. In an example, both the unfilled vias and openings can be formed by mechanical methods, such as drilling or the like.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic interconnection component, comprising:
   a semiconductor material layer having a first surface and a second surface opposite the first surface and spaced apart in a first direction therefrom by a thickness of the semiconductor material layer;
   at least two metalized vias, each extending through the semiconductor material layer and having a first end at the first surface and a second end at the second surface, a first pair of the at least two metalized vias being spaced apart from each other in a second direction orthogonal to the first direction; and
   first and second insulating vias in the semiconductor layer each extending from the first surface toward the second surface, the first and second insulating vias each being positioned such that a geometric center of each of the insulating vias is between first and second planes that are orthogonal to the second direction and that pass through first and second respective vias of the first pair of the at least two metalized vias,
   wherein a dielectric material at least partially fills or at least partially encloses a void in each of the first and second insulating vias, each of the first and second insulating vias extending through at least half of the thickness of the semiconductor material layer, the first insulating via having a first width in the second direction, the second insulating via having a second width in the second direction, the first width being less than the second width.

2. The microelectronic interconnection component of claim 1, wherein no portion of an interior volume of each of the first and second insulating vias has an electrical conductivity greater than an electrical conductivity of the semiconductor material layer.

3. The microelectronic interconnection component of claim 1, wherein each of the first and second insulating vias is positioned such that a theoretical line through each of the first pair of metalized vias passes through the geometric center of each of the first and second insulating vias.

4. The microelectronic interconnection component of claim 1, wherein each of the first and second insulating vias has a length in a third direction perpendicular to the second direction, the length being greater than a distance between the first pair of the at least two metalized vias.

5. The microelectronic interconnection component of claim 1, wherein each of the first and second insulating vias extends through the entire thickness of the semiconductor material layer.

6. The microelectronic interconnection component of claim 1, wherein the first and second insulating vias have different heights in the first direction.

7. The microelectronic interconnection component of claim 1, further comprising a redistribution layer overlying the first surface of the semiconductor material layer and having conductive contacts exposed at a top surface of the redistribution layer, the conductive contacts being electrically connected with one or more of the at least two metalized vias through conductive structure of the redistribution layer.

8. The microelectronic interconnection component of claim 1, further comprising third and fourth insulating vias in the semiconductor layer each extending from the first surface toward the second surface, the third and fourth insulating vias each being positioned such that a geometric center of the first and second respective vias of the first pair of the at least two metalized vias is between third and fourth planes that are orthogonal to the second direction and that pass through the respective third and fourth insulating vias.

9. The microelectronic interconnection component of claim 8, wherein the third insulating via has a third width in the second direction and the fourth insulating via has a fourth width in the second direction, the third width being less than the fourth width.

10. A microelectronic interconnection component, comprising:
    a semiconductor material layer having a first surface and a second surface opposite the first surface and spaced apart in a first direction therefrom by a thickness of the semiconductor material layer;
    at least two metalized vias, each extending through the semiconductor material layer and having a first end at the first surface and a second end at the second surface, a first pair of the at least two metalized vias being spaced apart from each other in a second direction orthogonal to the first direction; and
    a plurality of insulating vias in the semiconductor layer each extending from the first surface toward the second surface, each of the insulating vias each being positioned such that a geometric center of each of the insulating vias is between first and second planes that are orthogonal to the second direction and that pass through first and second respective vias of the first pair of the at least two metalized vias, the plurality of insulating vias including first and second insulating vias,
    wherein a dielectric material at least partially fills or at least partially encloses a void in each of the insulating vias, the first insulating via having a first height in the first direction, the second insulating via having a second height in the first direction, the first height being less than the second height.

11. The microelectronic interconnection component of claim 10, wherein the plurality of insulating vias further includes a third insulating via having a third height in the first direction, the third height being greater than each of the first and second heights.

12. The microelectronic interconnection component of claim 11, wherein the plurality of insulating vias further includes a fourth insulating via having the second height in the first direction, and a fifth insulating via having the first height in the first direction.

13. The microelectronic interconnection component of claim 12, wherein the third insulating via is positioned between the second and fourth insulating vias in the second direction, and the second and fourth insulating vias are each positioned between the first and fifth insulating vias in the second direction.

14. The microelectronic interconnection component of claim 10, wherein the plurality of insulating vias is a first plurality of insulating vias, the microelectronic interconnection component further comprising a second plurality of insulating vias in the semiconductor layer each extending from the second surface toward the first surface, each of the second plurality of insulating vias being positioned such that a geometric center thereof is between the first and second planes.

15. The microelectronic interconnection component of claim 10, wherein no portion of an interior volume of each of the first and second insulating vias has an electrical conductivity greater than an electrical conductivity of the semiconductor material layer.

16. The microelectronic interconnection component of claim 10, wherein each of the first and second insulating vias is positioned such that a theoretical line through each of the first pair of metalized vias passes through the geometric center of each of the first and second insulating vias.

17. The microelectronic interconnection component of claim 10, wherein each of the first and second insulating vias has a length in a third direction perpendicular to the second direction, the length being greater than a distance between the first pair of the at least two metalized vias.

18. The microelectronic interconnection component of claim 10, further comprising a microelectronic element overlying the first surface of the semiconductor material layer and electrically connected with one or more of the at least two metalized vias.

19. The microelectronic interconnection component of claim 18, further comprising a redistribution layer overlying the first surface of the semiconductor material layer, the microelectronic element mounted to the redistribution layer and electrically connected with the one or more of the at least two metalized vias through conductive structure of the redistribution layer.

20. The microelectronic interconnection component of claim 19, wherein the redistribution layer is a first redistribution layer, the microelectronic interconnection component further comprising a second redistribution layer overlying the second surface of the semiconductor material layer and having conductive structure electrically connected with the one or more of the at least two metalized vias.

* * * * *